United States Patent [19]
So et al.

[11] Patent Number: 5,925,980
[45] Date of Patent: Jul. 20, 1999

[54] ORGANIC ELECTROLUMINESCENT DEVICE WITH GRADED REGION

[75] Inventors: Franky So, Tempe; Song Q. Shi, Phoenix; Cynthia A. Gorsuch, Tempe, all of Ariz.; Hsing-Chung Lee, Calabasas, Calif.

[73] Assignee: Motorola, Inc., Schaumburg, Ill.

[21] Appl. No.: 08/850,316

[22] Filed: May 1, 1997

[51] Int. Cl.[6] .................................. H01J 1/62; H01J 63/04
[52] U.S. Cl. ......................... 313/504; 313/506; 313/507
[58] Field of Search ..................... 313/504, 506, 313/507, 503; 428/917, 690; 257/510; 252/519.2, 519.21

[56] References Cited

U.S. PATENT DOCUMENTS 5,151,629  9/1992  VanSlyke ............................. 313/504
5,755,999  5/1998  Shi et al. ............................. 252/301.16
5,804,322  9/1998  Shi et al. ............................. 428/690
5,834,130  11/1998  Kido ..................................... 428/690

*Primary Examiner*—Sandra O'Shea
*Assistant Examiner*—Michael J. Smith
*Attorney, Agent, or Firm*—Eugene A. Parsons; William E. Koch

[57] ABSTRACT

An organic electroluminescent device with graded region is formed, which includes a hole transporting region formed of hole transporting organic material, an electron transporting region formed of electron transporting organic material, and a graduated region disseminated between the hole transporting region and the electron transporting region. The graduated region changes, either in steps or continuously, from hole transporting organic material adjacent the hole transporting region to electron transporting organic material adjacent the electron transporting region. Electrical contacts are formed in communication with the hole transporting region and the electron transporting region.

2 Claims, 1 Drawing Sheet

FIG. 1 -PRIOR ART-

ORGANIC ELECTROLUMINESCENT DEVICE WITH GRADED REGION

FIELD OF THE INVENTION

The present invention pertains to organic electroluminescent devices and more particularly to the interfaces between layers comprising the organic electroluminescent devices.

BACKGROUND OF THE INVENTION

Organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, individual OEDs and arrays of OEDs can be fabricated relatively cheaply and in a variety of sizes from very small (less than a tenth millimeter in diameter) to relatively large (greater than an inch). Also, OEDs have the added advantage that their emissive operation provides a very wide viewing angle and they are relatively bright.

Generally, OEDs include a first electrically conductive layer (or first contact), an electron transporting, a hole transporting layer and a second electrically conductive layer (or second contact). Either the electron transporting layer or the hole transporting layer can be designed as the emissive layer and the light can be transmitted either way but generally exits through one of the conductive layers. There are many ways to modify one of the conductive layers for the emission of light therethrough but it has been found generally that the most efficient OED includes one conductive layer which is transparent to the light being emitted. Also, one of the most widely used conductive, transparent materials is indium-tin-oxide (ITO), which is generally deposited in a layer on a transparent substrate such as a glass plate.

Some major problems that are prevalent in prior art OEDs are caused by the interface between the electron transporting layer and the hole transporting layer. Generally, electron transporting organic material and hole transporting organic material are not compatible and do not easily bond together. One explanation for this is that electron transporting organic material is generally a hydrophilic material and hole transporting organic material is generally a hydrophobic material. This incompatibility results in a rough interface which has a strong tendency to separate under higher temperatures. Thus, the reliability of the OED is substantially reduced. Also, this rough interface may actually result in higher hole injection barriers (especially if partial separation occurs) in OEDs which utilize the electron transport layer as the emission layer.

Accordingly, it would be highly advantageous to provide a smooth reliable region between the electron transporting layer and the hole transporting layer.

It is a purpose of the present invention to provide a new and improved organic electroluminescent device.

It is another purpose of the present invention to provide a new and improved organic electroluminescent device with an improved region between an electron transporting region and a hole transporting region.

It is still another purpose of the present invention to provide a new and improved organic electroluminescent device with improved reliability and operation.

It is a further purpose of the present invention to provide a new and improved method of fabricating organic electroluminescent devices.

It is still a further purpose of the present invention to provide a new and improved method of fabricating organic electroluminescent devices with a smooth reliable region between an electron transporting region and a hole transporting region.

SUMMARY OF THE INVENTION

The above problems and others are at least partially solved and the above purposes and others are realized in an organic electroluminescent device with graded region including a hole transporting region formed of hole transporting organic material, an electron transporting region formed of electron transporting organic material, and a graduated region disseminated between the hole transporting region and the electron transporting region, the graduated region changing from hole transporting organic material adjacent the hole transporting region to electron transporting organic material adjacent the electron transporting region. Electrical contacts are formed in communication with the hole transporting region and the electron transporting region.

The above problems and others are at least partially solved and the above purposes and others are further realized in a method of fabricating an organic electroluminescent device with graded region including the steps of providing a supporting substrate with a first electrical contact formed thereon and placing the supporting substrate in a vacuum chamber and providing a source of hole transporting organic material and a source of electron transporting organic material in the vacuum chamber. In a preferred embodiment, the hole transporting organic material is deposited alone onto the supporting substrate in communication with the first electrical contact to form a hole transporting region and the deposition is gradually changed to deposit the electron transporting organic material alone onto the supporting substrate to form an electron transporting organic region, whereby a graduated region is disseminated between the hole transporting region and the electron transporting region. The graduated region changes from hole transporting organic material adjacent the hole transporting region to electron transporting organic material adjacent the electron transporting region.

BRIEF DESCRIPTION OF THE DRAWINGS

Referring to the drawings:

FIG. 1 is an energy level diagram for a prior art organic electroluminescent device;

DESCRIPTION OF THE PREFERRED EMBODIMENTS

Turning now to the drawings, FIG. 1 is an energy level diagram for a prior art organic electroluminescent device. The prior art electroluminescent devices generally include first and second electrical contacts (not shown) with at least a hole transporting layer and an electron transporting layer sandwiched therebetween. The hole transporting layer is represented by an energy level 10 in FIG. 1 and the electron transporting layer is represented by an energy level 12. It should be noted that holes traversing the hole transporting layer and injected into the electron transporting layer, for a device in which the electron transporting layer is the light emitter, must have sufficient energy to overcome an energy difference ΔE between the two layers. Similarly, electrons traversing the electron transporting layer and injected into the hole transporting layer, for a device in which the hole transporting layer is the light emitter, must have sufficient energy to overcome an energy difference ΔE between the two layers.

In all known devices, the hole transporting layer and the electron transporting layer are formed in abutting engagement and the interface is very poor. Generally, the hole transporting material and the electron transporting material include one of a hydrophobic aromatic amine compound and a hydrophilic organometallic complex and are not compatible and do not adhere well together. This poor adhesion has a tendency to produce separations under certain conditions, e.g. higher operating temperature, which results in poor reliability and early failures. Further, the poor interface between the layers may actually contribute to a higher energy difference (ΔE) which must be overcome for the carriers to travel through the device.

Figure 2:
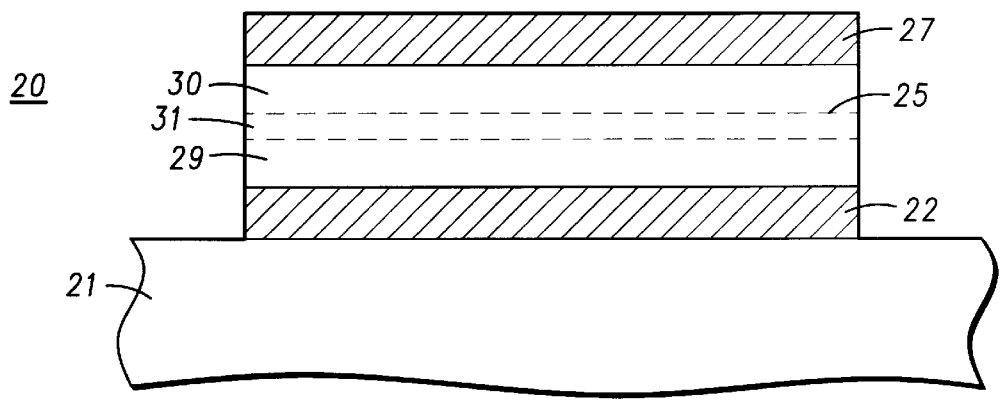
FIG. 2 is a greatly enlarged simplified sectional view of an organic electroluminescent device in accordance with the present invention.

Referring specifically to FIG. 2, a greatly enlarged simplified sectional view of an organic electroluminescent device 20 in accordance with the present invention is illustrated. Device 20 includes a supporting substrate 21 of silicon, glass, hard plastic, or other convenient material with a first electrical contact 22 formed thereon. In a preferred embodiment, substrate 21 is formed of glass or a hard clear plastic and contact 22 is formed of an optically clear electrically conductive material, such as indium-tin-oxide (ITO). In this embodiment, contact 22 is the anode of device 20.

A layer 25 of organic semiconductor material is formed on contact 22 and a second electrical contact 27 is formed on the upper surface of layer 25. In this specific embodiment, contact 27 is the cathode of device 20 and generally includes a thin layer of low work function material (e.g. lithium, magnesium, etc.) in combination with a stable metal of high work function (e.g. aluminum, silver) as contact metal, the stable metal being formed thereon to provide a better electrical contact, as well as protection, and/or passivation, for the low work function material.

Layer 25 is illustrated and described as a single layer of material, because of the manner in which it is formed and because of its consistency. Generally, the hole transporting and electron transporting materials are deposited on a surface by any of the well known evaporation or sputtering techniques. As a typical example, substrate 21 with contact 22 formed thereon is positioned in an evaporation chamber (not shown). A source of electron transporting organic material and a source of hole transporting organic material are positioned in the evaporation chamber. In the preferred embodiment the two sources are in separate containers which can be gradually and continuously opened or closed.

The process starts by closing the container for the electron transporting material and opening the container for the hole transporting material. Initially only the hole transporting organic material is evaporated onto supporting substrate 21 in communication with electrical contact 22 to form a hole transporting region, designated 29. A thickness of approximately 50 to 1000 Å is generally sufficient. Gradually the container with the hole transporting material is closed and the container with the electron transporting material is opened until only the electron transporting material is being evaporated. Evaporation of the electron transporting material alone continues until an electron transporting region 30 is formed, a thickness of approximately 50 to 1000 Å is generally sufficient. The gradual change in the evaporating material between hole transporting region 29 and electron transporting region 30 results in a graduated region 31 disseminated between hole transporting region 29 and the electron transporting region 30. Graduated region 31, which includes hole transporting organic material and electron transporting organic material, gradually changes from hole transporting organic material adjacent hole transporting region 29 to electron transporting organic material adjacent electron transporting region 30.

Figure 3:
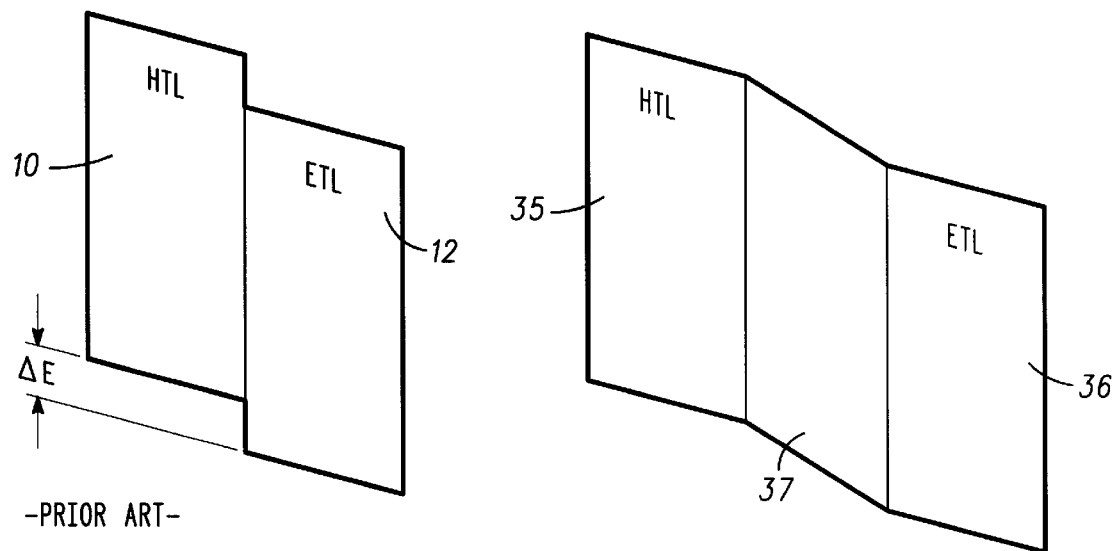
FIG. 3 is an energy level diagram for a first embodiment of the organic electroluminescent device of FIG. 2.

Because of the gradual change from hole transporting organic material to electron transporting organic material in graduated region 31, the two materials are intermixed and disseminated so that no fixed interface is formed and the adhesion problem is resolved. Layer 25 appears as a single layer of material which cannot separate and generally allows a smooth movement of carriers thereacross. Referring to FIG. 3, hole transporting region 29 is represented by energy level 35, electron transporting region 30 is represented by energy level 36, and graduated region 31 is represented by energy level 37, which is a smooth transition from energy level 35 to energy level 36.

Figure 4:
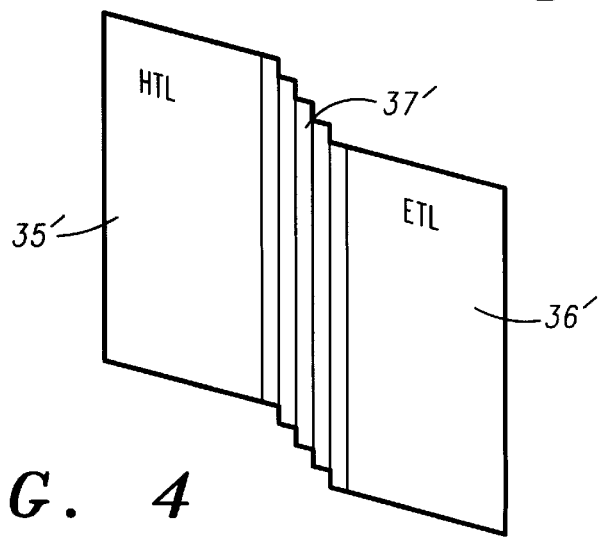
FIG. 4 is an energy level diagram for another embodiment of the organic electroluminescent device of FIG. 2.

In a somewhat different embodiment, illustrated by an energy level diagram in FIG. 4, hole transporting region 29 is represented by an energy level 35' and electron transporting region 30 is represented by an energy level 36'. In this embodiment graduated region 31 is formed by a series of small steps in which the hole transporting material is reduced as the electron transporting material is increased. Thus, energy level 37', representative of graduated region 31, is illustrated as a series of small energy steps. In this structure the carriers need only small amounts of energy to traverse each step in the graduated region.

Accordingly, a new and improved method has been disclosed for fabricating a new organic semiconductor layer for electroluminescent devices which includes a smooth reliable dissemination of hole transporting material and electron transporting material between the hole transporting region and the electron transporting region. While evaporation is presently the primary method for depositing these materials, it will be understood by those skilled in the art that the present method applies to any other techniques (e.g. sputtering) which might be utilized or devised. It should also be understood that while the above example described the hole transporting region positioned on an electrical contact on the substrate, the hole and electron transporting layers can be reversed in some applications and additional layers may be utilized in various OEDs for additional purposes. Fluorescent dyes used to improve the performance of OEDs can also be introduced in either the hole transporting region or the electron transporting region of the embodied device. The improved layer of organic material provides for the fabrication of new and improved organic electroluminescent devices with improved reliability and operation.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic electroluminescent device with graded region comprising:

a hole transporting region formed of hole transporting organic material including one of an organometallic complex and an aromatic amine compound;

an electron transporting region formed of electron transporting organic material including one of an organometallic complex and an aromatic amine compound;

a graduated region including hole transporting organic material and electron transporting organic material disseminated between the hole transporting region and the electron transporting region, the graduated region changing from hole transporting organic material adjacent the hole transporting region to electron transporting organic material adjacent the electron transporting region in a plurality of stages; and electrical contacts in communication with the hole transporting region and the electron transporting region.

2. An organic electroluminescent device with graded region comprising:

a hole transporting region formed of hole transporting organic material including one of an organometallic complex and an aromatic amine compound;

an electron transporting region formed of electron transporting organic material including one of an organometallic complex and an aromatic amine compound;

a graduated region including hole transporting organic material and electron transporting organic material disseminated between the hole transporting region and the electron transporting region, the graduated region changing from hole transporting organic material adjacent the hole transporting region to electron transporting organic material adjacent the electron transporting region in a substantially continuous transition; and electrical contacts in communication with the hole transporting region and the electron transporting region.

* * * * *